US006275973B1

(12) United States Patent
Wein (10) Patent No.: US 6,275,973 B1
(45) Date of Patent: Aug. 14, 2001

(54) INTEGRATED CIRCUIT DESIGN WITH DELAYED CELL SELECTION

(75) Inventor: Enno Wein, Livermore, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/183,637

(22) Filed: Oct. 30, 1998

(51) Int. Cl.$^7$ .................................................. G06F 17/50
(52) U.S. Cl. .................. 716/10; 716/12; 716/18
(58) Field of Search ........................................... 716/1–21

(56) References Cited

U.S. PATENT DOCUMENTS

| 5,633,805 | * | 5/1997 | Simonsen | 716/18 |
|---|---|---|---|---|
| 5,663,662 | * | 9/1997 | Kurosawa | 326/41 |
| 5,666,288 | * | 9/1997 | Jones et al. | 716/17 |
| 5,689,432 | * | 11/1997 | Blaauw et al. | 716/18 |
| 5,724,250 | * | 3/1998 | Kerzman et al. | 716/3 |
| 5,754,826 | * | 5/1998 | Gamal et al. | 703/14 |
| 5,764,525 | * | 6/1998 | Mahmood et al. | 716/18 |
| 5,898,595 | * | 4/1999 | Bair et al. | 716/2 |
| 5,963,727 | * | 10/1999 | Shih et al. | 716/1 |
| 6,167,557 | * | 12/2000 | Kudva et al. | 716/6 |

OTHER PUBLICATIONS

Benini et al. ("Iterative remapping for logic circuits", IEEE Transactions on Computer–Aided Design of Integrated Circuits and Systems, vol. 17, No. 10, pp. 948–964), Oct. 1998.*

Tanir et al. ("The design of a library support system for a telecommunication system synthesis environment", Proceedings of Fourth International Workshop on Rapid System Prototyping, 1993: Shortening the Path from Specification to Prototype, Jun. 28, 1993.*

Herbert ("An integrated design and characterization environment for the development of a standard cell library", Proceedings of the IEEE 1991 Custom Integrated Circuits Conference, May 12, 1991, pp. 25.6/1–5).*

* cited by examiner

Primary Examiner—Matthew Smith
Assistant Examiner—Phallaka Kik
(74) Attorney, Agent, or Firm—Mitchell, Silberberg & Knupp LLP (57) ABSTRACT

Integrated circuit chip design in which a technology-independent description of an integrated circuit design is obtained. A first component is selected from a pre-defined first library based on the technology-independent description, and an interconnection is specified between the first component and a second component based on the technology-independent description. The first component and the second component are laid out on a surface of the integrated circuit chip so as to obtain an initial layout, and a routing characteristic for the interconnection is estimated based on the initial layout. The first component is then replaced with a new component selected from a pre-defined second library based on the routing characteristic. According to this aspect of the invention, the pre-defined first library is smaller than the pre-defined second library.

26 Claims, 3 Drawing Sheets

INTEGRATED CIRCUIT DESIGN WITH DELAYED CELL SELECTION

BACKGROUND OF THE INVENTION

1. Field of the Invention

The present invention concerns design of integrated circuits (ICs) and particularly relates to a faster method for designing an integrated circuit by delaying selection of specific cells.

2. Description of the Prior Art

Figure 1:
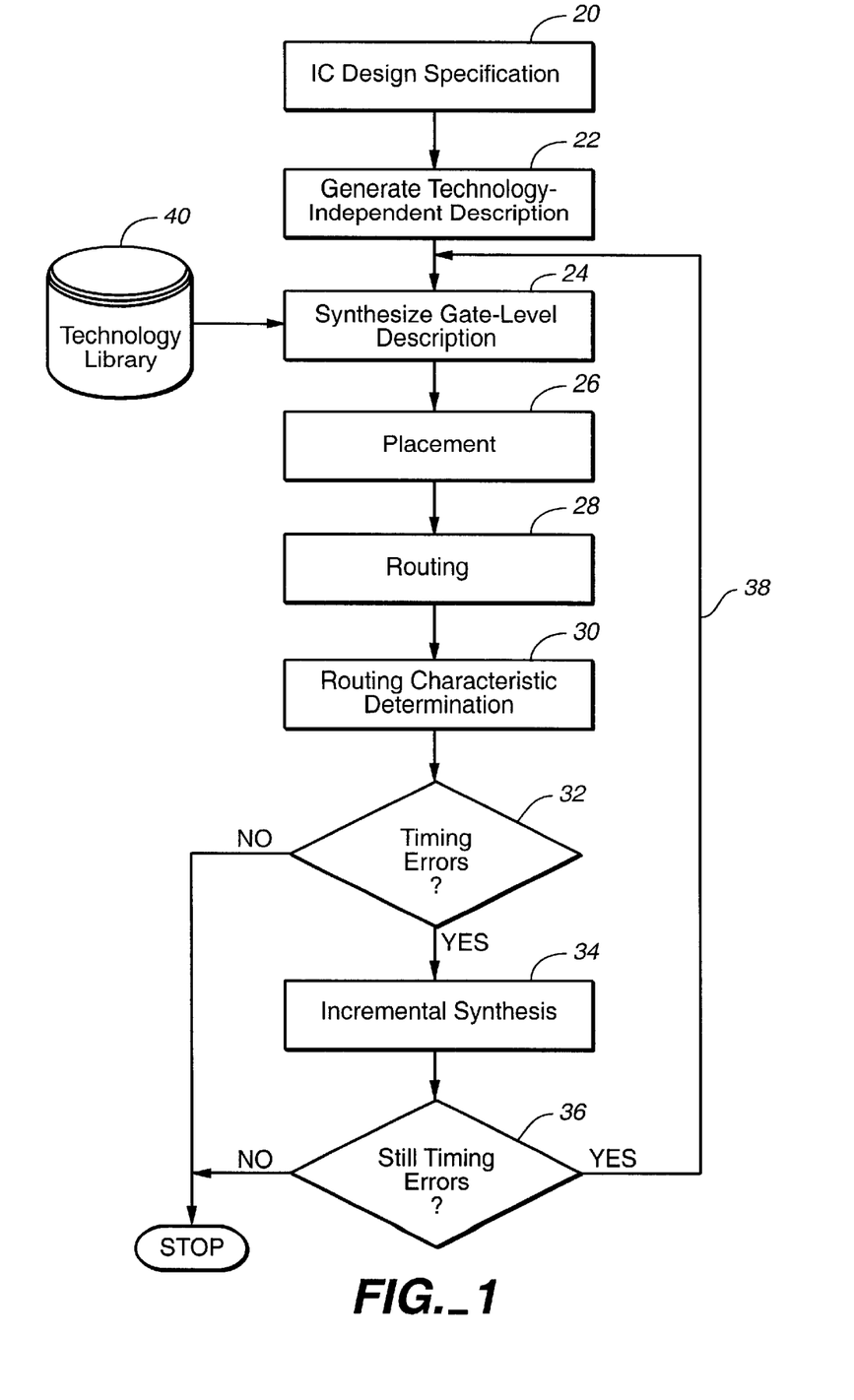
FIG. 1 is a flow diagram illustrating a conventional technique of integrated circuit design.

Current integrated circuits frequently contain hundreds of thousands or millions of interconnected electronic devices. Designing an integrated circuit so that such a large number of devices interact to provide the desired functionality can be a difficult task. Moreover, due to the increasing demand for quick turnaround-time application-specific integrated circuits, it is desired that the design process be completed as quickly as possible. Accordingly, a highly structured multi-step process has evolved. FIG. 1 illustrates a flow diagram for explaining one example of such a conventional integrated circuit design technique.

Initially, an IC design specification is produced in step 20. From that specification, a technology-independent circuit description is generated in step 22. Thereafter, in synthesis step 24 a gate-level description is synthesized based on the input technology-independent description.

Conventionally, synthesis step 24 typically inputs a circuit description in a hardware description language (HDL) and/or in a register transfer language (RTL). From that description, specific electronic components (or "cells") are selected from a technology library 40 so as to implement the required functionality. Because actual physical devices are selected in this step, actual performance criteria typically are considered when making these selections. Thus, for example, if an AND gate is required, then synthesis step 24 will select from among a number of AND gates in the technology library 40 based on timing considerations. In general, timing will be a function of output drive strength and the amount of load required to be driven by the gate. Thus, higher drive strength gates typically will have lower delay times for a given load than will lower drive strength gates.

In addition to selecting from among components having the same functions but different drive strengths, fundamental architectural decisions also are made in synthesis step 24. In fact, these two types of decisions are actually interrelated, since one architectural choice may be acceptable in connection with higher drive strength gates, but would produce timing errors when used in connection with lower drive strength gates. Accordingly, synthesis step 24 ordinarily requires a significant amount of processing time to obtain an optimal combination of these interrelated considerations.

As noted above, synthesis step 24 attempts to meet the timing constraints specified by the design; timing, in turn, typically is a function of the amount of load each gate must drive. In this regard, load generally consists of gate load and wire load. Because synthesis step 24 is selecting the gates, it usually can accurately predict the amount of gate load. However, wire load ordinarily must be estimated, typically by using a generic wire load model.

The output of synthesis step 24 is a netlist, which specifies particular components and also specifies all required interconnections between those components. In placement step 26, the components in the netlist are laid out on the surface of the integrated circuit chip. In step 28, connections are routed between the individual components. Based on that routing, step 30 determines routing characteristics, such as wire load. Such wire load models historically have not been very accurate.

In step 32, it is determined whether timing errors exist. Such errors exist mainly because actual wire load often varies from the wire load estimated using the generic wire load model in synthesis step 24. If such errors are in fact present, incremental synthesis is attempted in step 34 to resolve those timing errors. Such incremental synthesis attempts to achieve timing closure by making relatively minor changes in the design. Incremental synthesis step 34 might, for example, substitute higher drive strength gates for existing gates in the design in an attempt to eliminate those timing errors.

In step 36, it is then determined whether any errors still exist which can not be corrected by the relatively minor changes made during incremental synthesis step 34. If any such errors still exist, then processing returns to step 24 in order to perform full synthesis once again in an attempt to correct such errors. It is noted that re-execution of full synthesis is often required in this conventional technique due to poor architectural decisions made during the initial synthesis.

For example, assume that an adder is required. Based on the generic wire load model information, initial synthesis might have determined that by using sufficiently high drive-strength cells timing constraints could be met by using a relatively slow ripple-adder structure. However, when routing has been completed, it might be determined that wire load is actually much higher than the wire load model had predicted. In fact, in these conventional techniques, it is not uncommon to discover that actual loads are 10 to 20 times greater than predicted by the model. Because high drive-strength components were used initially, there might not be available sufficiently higher drive-strength components to accommodate such a substantially higher wire load. Therefore, the only option might be to re-execute full synthesis utilizing the new information. Upon such re-execution, the synthesis step might select a faster adder circuit implementation.

In fact, due to the inaccuracies of current wire load models, many such design changes typically will be required after the first pass. Therefore, upon completion of the second full synthesis, the design might be so significantly different that the placement, routing and resulting routing characteristics (such as wire loads) also end up being significantly different than in the first pass. As a result, loop 38 may need to be repeated several times until all timing errors have been eliminated (i.e., timing closure achieved).

What is needed, therefore, is a more efficient process for designing an integrated circuit. In particular, it would be desirable to have a process that both completed initial synthesis faster and reduced the number of iterations required to be performed. Previous efforts to solve these problems mainly have focused on improving the wire load model used. However, for the most part, these efforts have not achieved a great degree of success.

SUMMARY OF THE INVENTION

The present invention therefore addresses the foregoing problems by first performing placement and either routing or routing estimation, using a component selected from a first library, and then replacing that component with a new component selected from a second, larger library based on a routing characteristic.

Thus, in one aspect, the invention concerns integrated circuit chip design in which a technology-independent description of an integrated circuit design is obtained. A first component is selected from a pre-defined first library based on the technology-independent description, and an interconnection is specified between the first component and a second component based on the technology-independent description. The first component and the second component are laid out on a surface of the integrated circuit chip so as to obtain an initial layout, and a routing characteristic for the interconnection is estimated based on the initial layout. The first component is then replaced with a new component selected from a pre-defined second library based on the routing characteristic. According to this aspect of the invention, the pre-defined first library is smaller than the pre-defined second library.

In a further aspect, the invention concerns integrated circuit chip design in which a technology-independent description of an integrated circuit design is obtained. A first component is selected from a pre-defined first library based on the technology-independent description, and an interconnection is specified between the first component and a second component based on the technology-independent description. The first component and the second component are then laid out on a surface of the integrated circuit chip so as to obtain an initial layout, and wire load is estimated for the interconnection based on the initial layout. The first component is then replaced with a new component selected from a pre-defined second library based on the estimated wire load. According to this aspect of the invention, the first component is selected to perform a particular function, the pre-defined second library has more components that perform the particular function than the pre-defined first library, and the new component is selected from among the components performing the particular function based on a desired timing characteristic.

In a still further aspect, the invention concerns integrated circuit chip design in which a technology-independent description of an integrated circuit design is obtained. A netlist is synthesized by selecting initial components from a pre-defined first library and specifying interconnections between the initial components, based on the technology-independent description. The initial components are laid out on a surface of the integrated circuit chip so as to obtain an initial layout, and routing characteristics are estimated for the interconnections based on the initial layout. Plural of the initial components are then replaced with new components selected from a pre-defined second library based on the routing characteristics. It is a feature of this aspect of the invention that the initial components are selected to perform functions, and the pre-defined second library has more components satisfying each of the functions than the pre-defined first library.

By virtue of the foregoing arrangements, the entire design process generally can be completed much faster than conventional techniques would permit. Specifically, by delaying access to the larger technology library until after completion of placement and routing, the present invention often can retain enough flexibility to avoid most timing problems, thus frequently avoiding the need for repeated iterations of the design cycle. In addition, by constraining component selection to a smaller library in the first instance, the initial design usually can be created much faster than when using conventional techniques.

In more particularized aspects, the first library includes only one component for each function. According to this aspect of the invention, the initial design step can focus almost exclusively on architectural decisions, rather than having to balance architectural decisions against specific component choice. As a result, initial design generally can be completed very quickly. At the same time, by utilizing a larger library after placement and routing characteristic estimation, enough timing flexibility ordinarily can be preserved so as to accommodate most deviations from the wire loads estimated using the underlying wire load model.

The foregoing summary is intended merely to provide a brief description of the general nature of the invention. A more complete understanding of the invention can be obtained by referring to the claims and the following detailed description of the preferred embodiments in connection with the accompanying figures.

DESCRIPTION OF THE PREFERRED EMBODIMENTS

Figure 2:
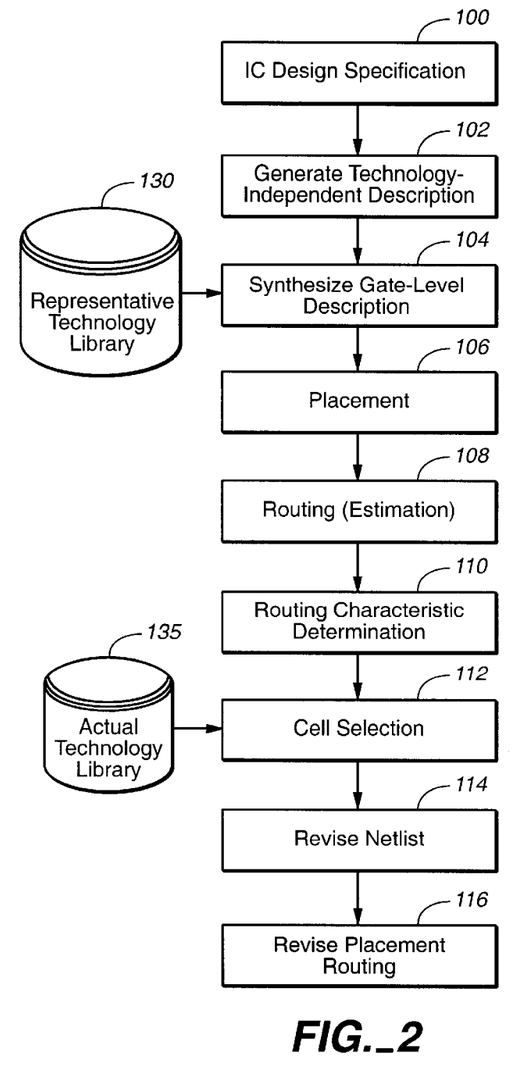
FIG. 2 is a flow diagram for explaining integrated circuit design according to a preferred embodiment of the invention.

FIG. 2 illustrates a flow diagram for explaining integrated circuit chip design according to the preferred embodiment of the invention. Briefly according to FIG. 2, an IC design specification is prepared; a technology-independent description of a system corresponding to the design specification is generated; a gate-level circuit description is synthesized from the technology-independent description utilizing components having characteristics representative of the components in the actual technology library; cell placement is performed; wire routing (or routing estimation) is performed; routing characteristics, such as wire loads, are determined; actual components are selected from the technology library based on the determined wire load information; the netlist is revised to reflect substitution of the actual components; and placement is revised to reflect the actual sizes of the selected components.

In more detail, in step 100 an IC system design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a technology-independent description is generated. The technology-independent description describes a system that will satisfy the IC design specification prepared in step 100. Preferably, the technology-independent description of this system is written using a highly structured syntax so as to permit subsequent steps in the design cycle to be performed using automated computer-aided design (CAD) tools. More preferably, the technology-independent description is written in a hardware description language (HDL) such as VHDL (IEEE Standard 1076-1993) or Verilog-HDL. VHDL, in particular allows a designer to describe a system using a functional description (e.g., a hierarchical arrangement of interconnected components), a behavioral description (e.g., sequential program statements that are similar to those of a high-level programming language), a data-flow description (e.g., synchronous and asynchronous state machines, data paths, arithmetic operators and registers), which may include register transfer level (RTL) description, a logic level description (e.g., Boolean algebra), or by using any combination of these different description types. Ordinarily, the HDL code will be written manually. However, it is also possible to take advantage of code development tools and pre-existing code libraries.

In step 104, a gate-level description is synthesized using components selected from representative technology library 130. Preferably, representative technology library 130 is smaller than the library of actual available components 135, and the components in representative technology library 130 are representative of the components in the actual technology library 135. For each particular function, the actual technology library 135 frequently will have several different components, each with different electrical properties. In particular, the components for each function in actual technology library 135 typically will have different drive strengths. Accordingly, under identical loads, the different components for each function in actual technology library 135 will provide different timing characteristics.

For each such function, representative technology library 130 includes fewer components. As indicated above, those fewer components will have timing characteristics that are representative of the components performing the same function in the actual technology library 135, under assumed load conditions. In order to specify these representative timing characteristics, preferably a wire load model is assumed.

In the preferred embodiment, representative technology library 130 will include only one component for each function. Therefore, the delay for this one component will be representative of the delay for the corresponding components in the actual technology library 135, assuming a load given by an average expected fan-out and wire load. For instance, in the preferred embodiment, where representative technology library 130 has one component per function, the timing characteristic of that one component might be set equal to the average timing characteristic of the components in the actual technology library 135 performing the same function, under the assumed load conditions.

Moreover, rather than being fixed quantities, the timing characteristics of the components in the representative technology library 130 might be functions of actual fan-out, since actual fan-out is known at this step. Similarly, the timing characteristics of the components in representative technology library 130 might also (or instead) be functions of the particular applications in which the components are used and/or the module size, since the expected wire load likely will vary based on these factors.

Preferably, the components in representative technology library 130 also have sizes that are representative of the corresponding components in the actual technology library 135. Thus, for example, if each function is represented by only one component in the representative technology library 130, that component might have a size which is equal to the mean of the sizes of the components performing that function in the actual technology library 135. It is noted that the components in representative technology library 130 are specified so as to be representative of the components in actual technology library 135, and therefore may or may not correspond to actual physical components.

Figure 3:
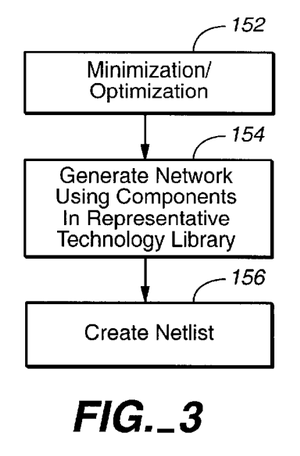
FIG. 3 is a flow diagram for describing synthesis according to a representative embodiment of the invention.

One example of synthesis step 104 will now be described with reference to the flow diagram shown in FIG. 3. Briefly, according to FIG. 3, the logic specified in the technology-independent description generated in step 102 is minimized and optimized, so as to obtain an efficient logical representation of the desired system; a network is generated using the components in the representative technology library; and a netlist is generated.

In more detail, in step 152 the logic portion of the technology-independent description is minimized and optimized. First, a minimum number of logical terms that will achieve the function is obtained. Then, redundancies are removed and intermediate levels of logic are added or removed to find a reduced logical expression that will achieve the function.

In step 154, the optimized description is mapped into a network of components from the representative technology library 130. Such components typically include simple gates and flip-flops. As noted above, in the preferred embodiment, only one component exists in representative technology library 130 for each such function. Therefore, rather than having to attempt to balance specific component selection against architectural choices, synthesis according to the present invention can focus instead merely on making appropriate architectural decisions. As a further result, synthesis according to the present invention often can be completed much faster than conventional synthesis. It is further noted that if the timing characteristic of the components is based on fan-out, as described above, synthesis will automatically tend to make architectural decisions designed to keep fan-out low.

In step 156, a netlist is created. The netlist categorizes a number of nets, each including one or more gates and/or flip-flops to be interconnected, and also describes the interconnections within those nets.

Returning to FIG. 2, in step 106 logic cells and other components selected in step 104 are laid out (or placed) on the surface of the integrated circuit chip. A main concern in performing placement is to reduce spacing between cells to be connected, as specified by the netlist, thereby minimizing the amount of wire routing that will need to be performed. In the preferred embodiment, placement in step 106 is performed in the same manner as conventional cell placement, using the cell size associated with each component, as described above.

In step 108, routing or routing estimation is performed with respect to the components laid out in step 106. Specifically, this step may perform a full routing, using any of the conventionally available routing techniques. Alternatively, routing distances may simply be estimated, such as by determining the minimum Manhattan distances between pairs of points to be connected. In either case, routing or routing estimation connects pins as specified by the netlist generated in step 104.

In step 110, routing characteristics such as wire load are determined based on the results of step 108. Wire load, in particular, ordinarily will depend on the routing length and often will depend on which metal layers are used for the routing. It is noted that much more accurate wire load and other routing characteristic information ordinarily can be obtained using information obtained from either the full routing or the routing estimation performed in step 108 than could be obtained from a conventional generic wire load model.

In step 112, utilizing the routing characteristic information (such as wire load) obtained in step 110, components selected from the representative technology library 130 are replaced in the layout with components from actual technology library 135. In the preferred embodiment, the main goal in replacing components in this step is to attempt to maintain the timing characteristics that were initially assumed for the components in the representative technology library 130 based on the underlying wire load model. Thus, for example, with respect to a particular component, if actual wire load for that component is greater than the wire load given by the underlying wire load model, a cell having a higher drive strength will be selected from actual technology library 135 to replace that component. Conversely, a lower actual wire load than predicted will require a cell from actual technology library 135 having a lower drive strength.

Selection of appropriate actual cells in this step preferably relies at least in part on the observation that drive strength divided by load is approximately constant for a given cell, at least within a particular range. Thus, by initially assigning appropriate representative timing characteristics to the components in representative technology library 130, and by selecting the appropriate components in step 112, those representative timing characteristics can be approximately maintained over a wide range of wire loads centered roughly around the load given by the underlying wire load model. Preferably, the LSI Logic IPO designer tool, which is conventionally used for optimizing a given implementation based on placement, is used to select appropriate actual components in this step.

In step 114, the netlist is revised to reflect the cell substitution performed in step 112.

In step 116, placement performed in step 106 is revised to reflect differences in actual physical size of the components substituted in step 112. Typically, such revisions will be relatively minor. Corresponding adjustments to routing (assuming full routing was performed in step 108) also are performed in this step. Alternatively, if only routing estimation was performed in step 108, a full wire routing is performed at this time.

It is noted that upon completion of step 116, it still might be necessary in certain cases to revise the circuit description in order to achieve timing closure. However, by postponing actual cell selection until after routing (or routing estimation) and routing characteristic estimation have been completed, the number of such cases generally will be significantly fewer than when using conventional techniques. That is, by delaying specific cell selection until a good estimate of wire load has been determined, the present technique retains enough flexibility to resolve most timing problems, thereby in many cases avoiding the need to perform repeated iterations.

Moreover, even if revision of the circuit description still is required, the process generally still will be much faster than conventional techniques because reaching a point where such a determination can be made generally will have been much faster. The reason for this, as mentioned above, is that the synthesis step in the present invention typically will not have spent significant amounts of time attempting to optimize the design by selecting specific components. It is noted that in the conventional design process, frequently most of such time will have been wasted because the design will have to be significantly revised.

Fabrication

Upon completion of design, as described above, the integrated circuit can be fabricated using the masks generated using the placement and routing information determined above, but otherwise employing conventional fabrication techniques. During fabrication, these masks are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment

Figure 4:
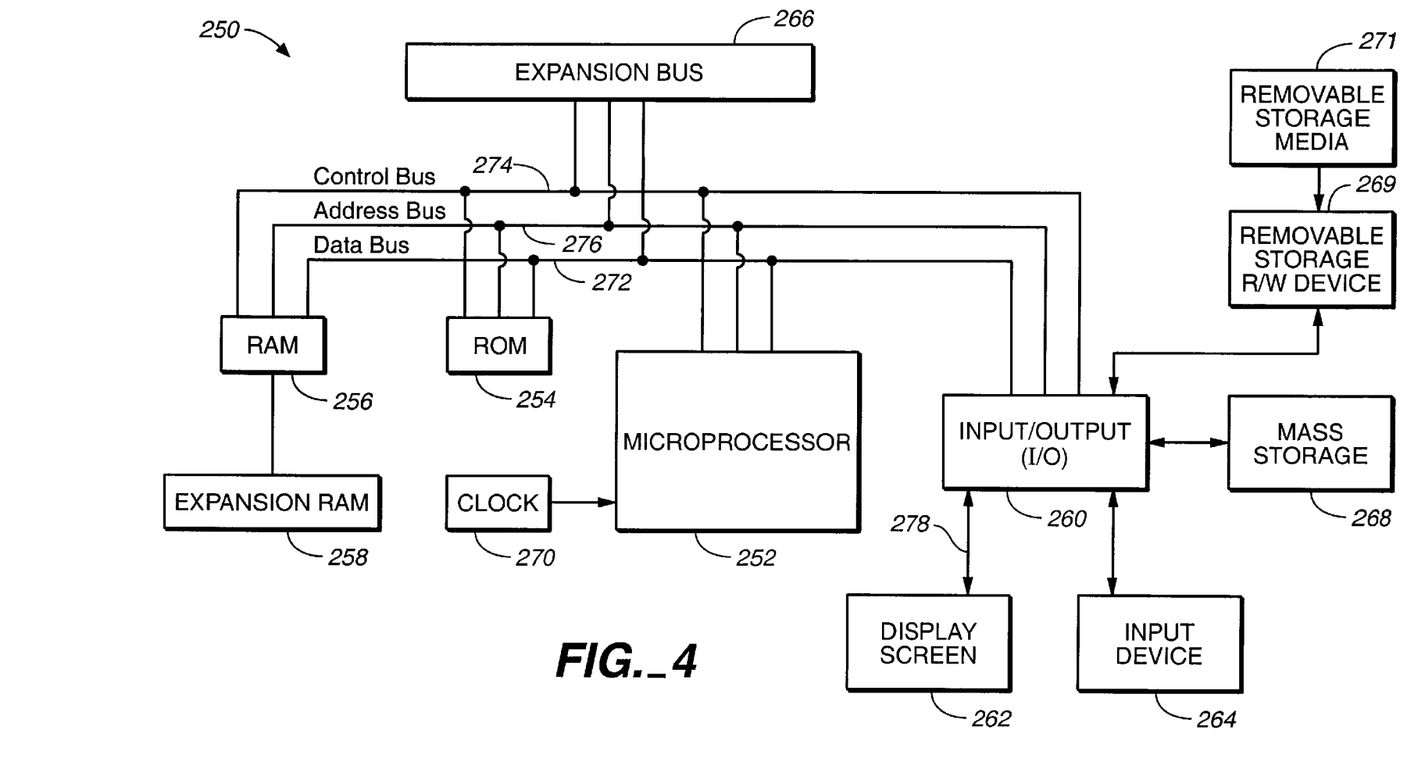
FIG. 4 is a block diagram of a general-purpose computer system, representing one suitable computer platform for implementing the methods of the invention.

Generally, the methods described herein with respect to IC design will be practiced with a general purpose computer, either with a single processor or multiple processors. FIG. 4 is a block diagram of a general purpose computer system, representing one of many suitable computer platforms for implementing the methods described above. FIG. 4 shows a general purpose computer system 250 in accordance with the present invention. As shown in FIG. 4, computer system 250 includes a central processing unit (CPU) 252, read-only memory (ROM) 254, random access memory (RAM) 256, expansion RAM 258, input/output (I/O) circuitry 260, display assembly 262, input device 264, and expansion bus 266. Computer system 250 may also optionally include a mass storage unit 268 such as a disk drive unit or nonvolatile memory such as flash memory and a real-time clock 270.

CPU 252 is coupled to ROM 254 by a data bus 272, control bus 274, and address bus 276. ROM 254 contains the basic operating system for the computer system 250. CPU 252 is also connected to RAM 256 by busses 272, 274, and 276. Expansion RAM 258 is optionally coupled to RAM 256 for use by CPU 252. CPU 252 is also coupled to the I/O circuitry 260 by data bus 272, control bus 274, and address bus 276 to permit data transfers with peripheral devices.

I/O circuitry 260 typically includes a number of latches, registers and direct memory access (DMA) controllers. The purpose of I/O circuitry 260 is to provide an interface between CPU 252 and such peripheral devices as display assembly 262, input device 264, and mass storage 268.

Display assembly 262 of computer system 250 is an output device coupled to I/O circuitry 260 by a data bus 278. Display assembly 262 receives data from I/O circuitry 260 via bus 278 and displays that data on a suitable screen.

The screen for display assembly 262 can be a device that uses a cathode-ray tube (CRT), liquid crystal display (LCD), or the like, of the types commercially available from a variety of manufacturers. Input device 264 can be a keyboard, a mouse, a stylus working in cooperation with a position-sensing display, or the like. The aforementioned input devices are available from a variety of vendors and are well known in the art.

Some type of mass storage 268 is generally considered desirable. However, mass storage 268 can be eliminated by providing a sufficient mount of RAM 256 and expansion RAM 258 to store user application programs and data. In that case, RAMs 256 and 258 can optionally be provided with a backup battery to prevent the loss of data even when computer system 250 is turned off. However, it is generally desirable to have some type of long term mass storage 268 such as a commercially available hard disk drive, nonvolatile memory such as flash memory, battery backed RAM, PC-data cards, or the like.

A removable storage read/write device 269 may be coupled to I/O circuitry 260 to read from and to write to a removable storage media 271. Removable storage media 271 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 250 by typing on a keyboard, manipulating a mouse or trackball, or "writing" on a tablet or on position-sensing screen of display assembly 262. CPU 252 then processes the data under control of an operating system and an application program, such as a program to perform steps of the inventive method described above, stored in ROM 254 and/or RAM 256. CPU 252 then typically produces data which is output to the display assembly 262 to produce appropriate images on its screen.

Expansion bus 266 is coupled to data bus 272, control bus 274, and address bus 276. Expansion bus 266 provides extra ports to couple devices such as network interface circuits, modems, display switches, microphones, speakers, etc. to CPU 252. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Conclusion

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for use in designing an integrated circuit chip, said method comprising:

obtaining a technology-independent description of an integrated circuit design;

selecting a first component from a pre-defined first library based on the technology-independent description;

specifying an interconnection between the first component and a second component based on the technology-independent description;

laying out the first component and the second component on a surface of the integrated circuit chip so as to obtain an initial layout;

estimating a routing characteristic for the interconnection based on the initial layout; and replacing the first component with a new component selected from a pre-defined second library based on the routing characteristic, wherein the pre-defined first library is smaller than the pre-defined second library.

2. A method according to claim 1, wherein the first component is selected to perform a particular function, and wherein the pre-defined second library has more components that perform the particular function than the pre-defined first library.

3. A method according to claim 2, wherein the pre-defined first library has exactly one component that performs the particular function.

4. A method according to claim 2, wherein the particular function is a logical function.

5. A method according to claim 2, wherein the new component is selected from among the components performing the particular function based on a desired timing characteristic.

6. A method according to claim 5, wherein the desired timing characteristic is approximated by selecting the new component based on drive strength.

7. A method according to claim 1, wherein the routing characteristic is estimated by performing an actual routing of the initial layout.

8. A method according to claim 1, wherein the routing characteristic comprises a wire load.

9. A method according to claim 1, wherein the technology-independent description is specified in a hardware description language.

10. A method according to claim 1, wherein the technology-independent description is specified in a register transfer language.

11. A method according to claim 1, wherein the first library is a technology library and wherein components in the first library correspond to actual physical components.

12. A method according to claim 1, wherein the first component has a timing characteristic that is equal to an average timing characteristic of components in the second library that perform a same function as the first component.

13. A method for use in designing an integrated circuit chip, said method comprising:

obtaining a technology-independent description of an integrated circuit design;

selecting a first component from a pre-defined first library based on the technology-independent description;

specifying an interconnection between the first component and a second component based on the technology-independent description;

laying out the first component and the second component on a surface of the integrated circuit chip so as to obtain an initial layout;

estimating a wire load for the interconnection based on the initial layout; and replacing the first component with a new component selected from a pre-defined second library based on the estimated wire load, wherein the first component is selected to perform a particular function, wherein the pre-defined second library has more components that perform the particular function than the pre-defined first library, and wherein the new component is selected from among the components performing the particular function based on a desired timing characteristic.

14. A method according to claim 13, wherein the pre-defined first library has exactly one component that performs the particular function, and wherein the exactly one component is specified so as to have a timing characteristic chosen to be representative of corresponding timing characteristics for the components performing the particular function in the pre-defined second library.

15. A method according to claim 14, wherein the desired timing characteristic is the timing characteristic assumed for the exactly one component.

16. A method according to claim 14, wherein the desired timing characteristic is approximated by selecting the new component based on drive strength.

17. A method according to claim 14, wherein the wire load is estimated by performing an actual routing of the initial layout.

18. A method for use in designing an integrated circuit chip, said method comprising:

obtaining a technology-independent description of an integrated circuit design;

synthesizing a netlist, by selecting initial components from a pre-defined first library and specifying interconnections between the initial components, based on the technology-independent description;

laying out the initial components on a surface of the integrated circuit chip so as to obtain an initial layout;

estimating routing characteristics for the interconnections based on the initial layout; and replacing plural of the initial components with new components selected from a pre-defined second library based on the routing characteristics, wherein the initial components are selected to perform functions, and wherein the pre-defined second library has more components satisfying each of the functions than the pre-defined first library.

19. A method according to claim 18, wherein for each of the functions, the pre-defined second library includes components having a wider range of a particular timing characteristic than components in the pre-defined first library.

20. A method according to claim 19, wherein the particular timing characteristic is based on drive strength under an assumed load condition.

21. A method according to claim 18, wherein for each of the functions, the components in the pre-defined first library are assumed to have timing characteristics chosen to be representative of corresponding timing characteristics for the components satisfying said each of the functions in the pre-defined second library.

22. A method according to claim 21, wherein the new components are selected based on the timing characteristics assumed for the initial components.

23. Computer-executable process steps stored on a computer readable medium, said process steps for use in designing an integrated circuit chip, said process steps comprising steps to:

obtain a technology-independent description of an integrated circuit design;

select a first component from a pre-defined first library based on the technology-independent description;

specify an interconnection between the first component and a second component based on the technology-independent description;

lay out the first component and the second component on a surface of the integrated circuit chip so as to obtain an initial layout;

estimate a routing characteristic for the interconnection based on the initial layout; and replace the first component with a new component selected from a pre-defined second library based on the routing characteristic, wherein the pre-defined first library is smaller than the pre-defined second library.

24. Computer-executable process steps stored on a computer readable medium, said process steps for use in designing an integrated circuit chip, said process steps comprising steps to:

obtain a technology-independent description of an integrated circuit design;

synthesize a netlist, by selecting initial components from a pre-defined first library and specifying interconnections between the initial components, based on the technology-independent description;

lay out the initial components on a surface of the integrated circuit chip so as to obtain an initial layout;

estimate routing characteristics for the interconnections based on the initial layout; and replace plural of the initial components with new components selected from a pre-defined second library based on the routing characteristics, wherein the initial components are selected to perform functions, and wherein the pre-defined second library has more components satisfying each of the functions than the pre-defined first library.

25. An apparatus for use in designing an integrated circuit chip, said apparatus comprising:

a processor for executing stored program instruction steps; and a memory connected to the processor for storing the program instruction steps, wherein the program instruction steps include steps to:

obtain a technology-independent description of an integrated circuit design;

select a first component from a pre-defined first library based on the technology-independent description;

specify an interconnection between the first component and a second component based on the technology-independent description;

lay out the first component and the second component on a surface of the integrated circuit chip so as to obtain an initial layout;

estimate a routing characteristic for the interconnection based on the initial layout; and replace the first component with a new component selected from a pre-defined second library based on the routing characteristic, wherein the pre-defined first library is smaller than the pre-defined second library.

26. An apparatus for use in designing an integrated circuit chip, said apparatus comprising:

a processor for executing stored program instruction steps; and a memory connected to the processor for storing the program instruction steps, wherein the program instruction steps include steps to:

obtain a technology-independent description of an integrated circuit design;

synthesize a netlist, by selecting initial components from a pre-defined first library and specifying interconnections between the initial components, based on the technology-independent description;

lay out the initial components on a surface of the integrated circuit chip so as to obtain an initial layout;

estimate routing characteristics for the interconnections based on the initial layout; and replace plural of the initial components with new components selected from a pre-defined second library based on the routing characteristics, wherein the initial components are selected to perform functions, and wherein the pre-defined second library has more components satisfying each of the functions than the pre-defined first library.

* * * * *